(12) United States Patent
Chung

(10) Patent No.: US 7,558,069 B2
(45) Date of Patent: Jul. 7, 2009

(54) EXTENSION STRUCTURE FOR PLASTIC MOLDING PORTABLE MEMORY PRODUCT

(75) Inventor: Chin-Hung Chung, Longtan Township, Taoyuan County (TW)

(73) Assignee: Hahntek Technology Corp., Taoyuan (TW)

( * ) Notice: Subject to any disclaimer, the term of this patent is extended or adjusted under 35 U.S.C. 154(b) by 0 days.

(21) Appl. No.: 11/968,643

(22) Filed: Jan. 2, 2008

(65) Prior Publication Data

US 2009/0040710 A1    Feb. 12, 2009

(30) Foreign Application Priority Data

Aug. 8, 2007    (TW) ............................... 96213008 U

(51) Int. Cl.
*H05K 7/10* (2006.01)
(52) U.S. Cl. .................. 361/737; 361/752; 361/756; 361/759; 439/131; 439/135
(58) Field of Classification Search ........... 361/737, 361/752, 747, 741, 740, 759, 756, 131; 439/131, 439/135, 136
See application file for complete search history.

(56) References Cited

U.S. PATENT DOCUMENTS

| | | | |
|---|---|---|---|
| 6,456,500 B1 * | 9/2002 | Chen ......................... | 361/752 |
| 6,963,468 B2 * | 11/2005 | Chang et al. ............. | 360/97.01 |
| 6,979,210 B2 * | 12/2005 | Regen et al. ............. | 439/131 |
| 7,090,515 B2 * | 8/2006 | Regen et al. ............. | 439/131 |
| 7,092,256 B1 * | 8/2006 | Salazar et al. ............ | 361/737 |
| 7,179,099 B2 * | 2/2007 | Hsieh ....................... | 439/131 |
| 7,287,705 B2 * | 10/2007 | Tang ......................... | 235/492 |
| 7,295,431 B2 * | 11/2007 | Chuang ..................... | 361/683 |
| 7,307,849 B2 * | 12/2007 | Ho et al. ................... | 361/737 |
| 7,311,460 B2 * | 12/2007 | Yu ............................. | 401/195 |
| 7,407,393 B2 * | 8/2008 | Ni et al. .................... | 439/131 |
| 7,416,419 B2 * | 8/2008 | Collantes et al. .......... | 439/76.1 |
| 7,422,454 B1 * | 9/2008 | Tang et al. ................. | 439/131 |
| 7,492,601 B2 * | 2/2009 | Salazar et al. ............ | 361/752 |
| 2007/0292009 A1 * | 12/2007 | Nguyen et al. ............ | 382/124 |

* cited by examiner

*Primary Examiner*—Dameon E Levi

(57) ABSTRACT

An extension structure for a plastic molding portable memory product includes an outer casing unit, an inner sliding unit, and a closing unit. The inner sliding unit is positioned inside the outer casing unit, and can be extended by sliding, whereas the closing unit is combined with the outer casing unit to ensure the inner sliding unit will not slip out. The outer casing unit is produced using one body formation method that is free from the traditional method of combining two pieces of structures through high frequency wave compression work sequence to effectively increase product yield, reduce cost and improve the cosmetics.

6 Claims, 3 Drawing Sheets

EXTENSION STRUCTURE FOR PLASTIC MOLDING PORTABLE MEMORY PRODUCT

BACKGROUND OF THE INVENTION (a) Field of the Invention

The present invention relates to a structural improvement of portable memory device, and particularly, to an extension structure for plastic molding portable memory product of which outer casing unit is produced using one body forming method.

(b) Description of the Prior Art

Due to the development of information technology, many modern people have to rely on computer for recording data, commonly called portable memory device such as thumb disk or portable disk. As it is easy to memorize and carry computer data, therefore they are widely used and loved by modern people.

Traditional portable memory device contains a circuit board inside. To adapt to the USB port for inserting into computer, a USB metallic insertion connector made of metal is required and in addition to the USB metallic insertion connector a top casing and a bottom casing have to be designed. After covering part of the PCB and USB metallic connection body with the two top casing and bottom casing mentioned above, the high frequency method is used to combine the top casing and bottom casing. In the conventional structure when manufacturer intend to perform high frequency combining of top casing and bottom casing work sequence, significant amount of poor yield exists, leading to significant failed product and resulting in loss of money. In addition, the said necessary high frequency combining work sequence cannot simplify manufacturing process and certain amount of finished products after compression are having less idealistic shapes.

In view of this the inventor of the present invention specifically invested in researching this case in the hope of improving the existing problems through proposing the present invention and expects to perfect the structure of the said product, reduce cost, and avoid defective product.

SUMMARY OF THE INVENTION

The purpose of the present invention of "Extension Structure For Plastic Molding Portable Memory Product" is in the design of a new type portable memory device to improve the conventional two pieces housing into single piece housing. The design could free the manufacturers in high frequency wave compression work sequence and effectively simplify manufacturing process, reduce defective rate, and further reduce cost, increase production volume, and lower selling price.

To achieve the above purpose, the embodiment of the present invention comprises outer casing unit, inner sliding unit, and closing unit, wherein the inner sliding unit is placed inside the outer casing unit and can slide in and out freely. The closing unit is to combine with the outer casing unit to ensure the inner sliding unit will not slip out. The outer casing unit of the present invention is manufactured using one body forming method in order to free from the high frequency wave compression work sequence of conventional two-piece structure. Such method could increase the product yield, reduce cost, and improve the outlook of the product.

The outer casing unit of the present invention is properly installed with a hollow section for providing space for the pressing element of the inner sliding unit to move along; both sides of the hollow space section are respectively installed with first slot and second slot, and the pressing element is designed to possess elasticity with spring installed beside the pressing element; thus when the pressing unit is moving inside the hollow section the relationship of the spring with respect to the first slot or the second slot is utilized to position the state of the extension or contraction of the inner sliding unit.

DETAILED DESCRIPTION OF THE PREFERRED EMBODIMENTS

Figure 1:
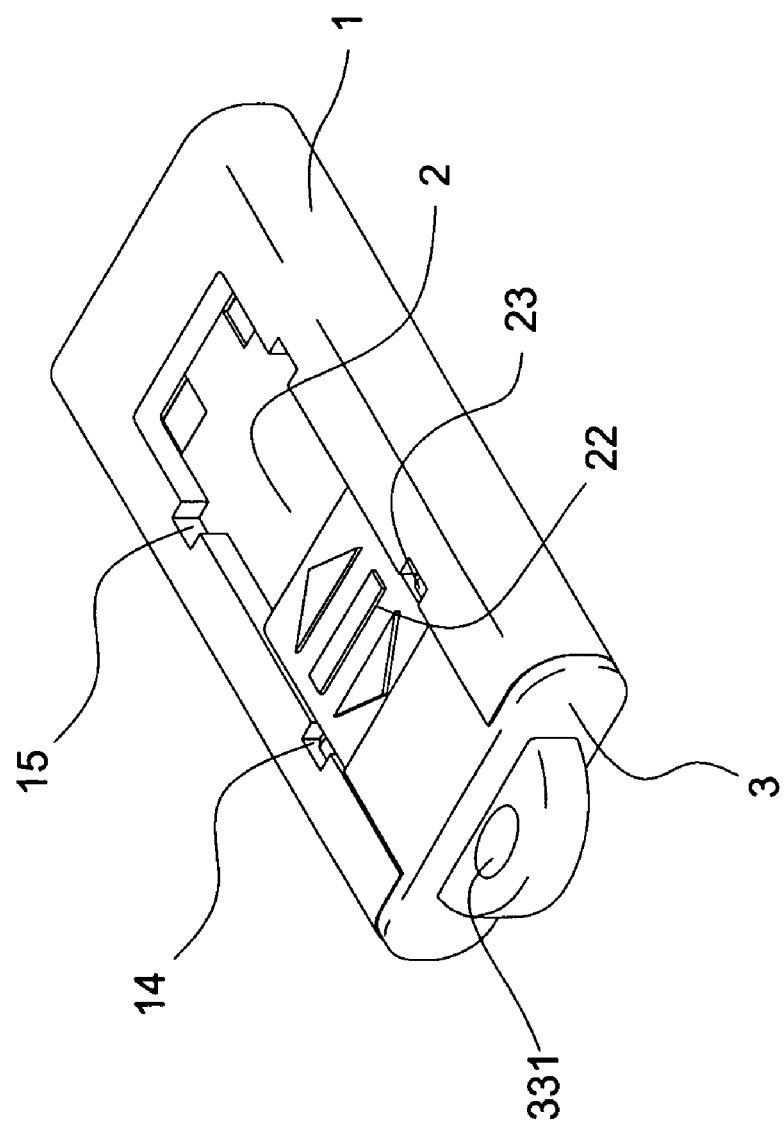
FIG. 1 is the perspective view of the present invention.
Figure 2:
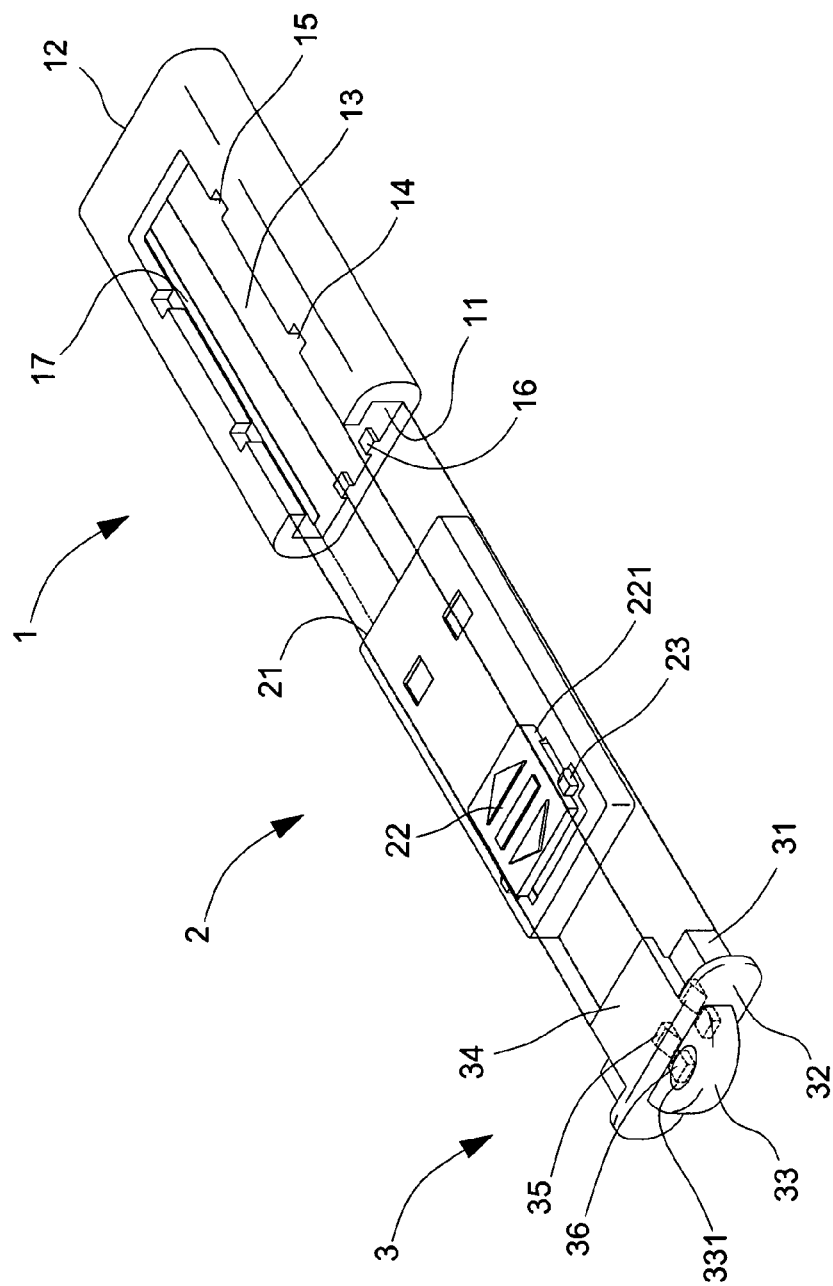
FIG. 2 is the exploded view of the present invention.

The structural composition and the function generated for the "Extension Structure For Plastic Molding Portable Memory Product" of the present invention is hereby described in detail below with the accompanied illustrations and a preferred embodiment:

FIG. 1 & FIG. 2 shows the "Extension Structure For Plastic Molding Portable Memory Product" comprising:

An outer casing unit 1 in the shape of slightly slender is produced with plastics in one body form, wherein the internal is a space 11, one end having an opening 12, one top face forms a hollow section 13, both sides of the hollow section 13 are installed with a first slot 14 and a second slot 15, in the proper location of the space 11 a click-in block 16 is installed, a sliding track 17 is installed at the bottom of the space 11;

an inner sliding unit 2 produced using plastic material in one body forming method for housing inside the space 11 of the outer casing unit 1 for sliding in and out, wherein the internal is installed with a conventional component of PCB, one end is USB insertion end 21, at proper location at the top is installed with a pressing element 22; the pressing element 22 is simply leaning on the connecting section 221 of the inner sliding unit 2, with the bottom of the pressing element 22 becoming hollow and having slight elastic function; the side of the pressing element 22 is installed with a corresponding spring 23;

a closing unit 3 produced using plastic material formed using one body method for tucking into the end of the space 11 of the outer casing unit 1, wherein the structure comprising a tucking element 31, at the top of the tucking element 31 a top board 34 is installed; another tucking element 31 with side board 32 is installed on the outside; outside of the side board 32 is installed with an extension element 33; the top of the extension element 33 is installed with a through hole 331; the bottom of the tucking element 31 in turn is installed with a guiding slot 35 and a click-in slot 36; the said guiding slot 35 and the click-in slot 36 is installed at the corresponding position of the click-in block 16.

With the above stated assembly, the inner sliding unit 2 is first placed inside the space 11 of the outer casing unit 1. Due to the installation of the spring 23, slight pressing of the pressing element 22 is required to go through; on placing the inner sliding unit 2 into the outer casing unit 1, the closing unit 3 is finally combined using the guiding slot 35 to connect the click-in block 16 inside the click-in slot 36, forming the tucking element 31 of the closing unit 3 to be tucked to the end of the space 11 and the top board 34 covering the hollow section 13 at the proper location.

Figure 3:
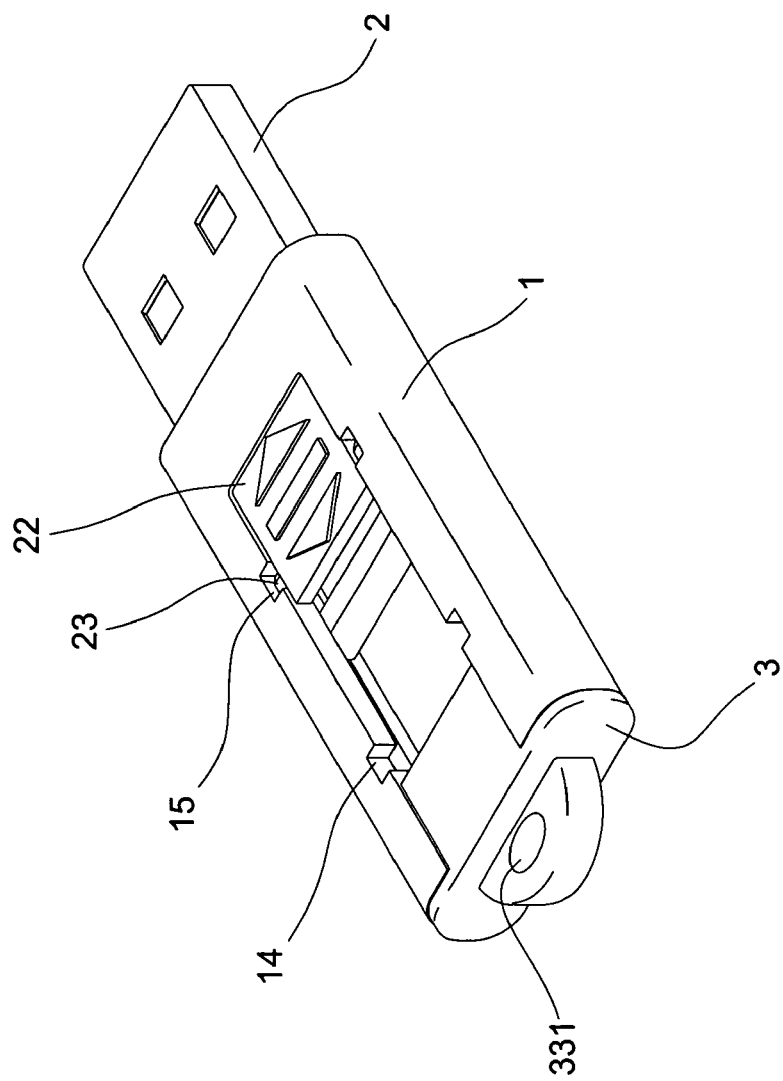
FIG. 3 is the state of use of the present invention.

When the inner sliding unit 2 is desired to extend outward, the pressing element 22 has to be depressed slightly to allow the spring 23 to lower its height in order to release from the first slot 14, then the inner sliding unit 2 slides outward and finally the spring 23 enters the second slot 15 to complete the extension and positioning function as shown in FIG. 3.

When contracting of inner sliding unit 2 is required, depress the pressing element 22 slightly will cause the spring 23 to lower its height and escape from the second slot 15, then move the inner sliding unit 2 inward until the spring 23 enters the first slot 14 to complete the inward contraction and positioning function and return to the state of FIG. 1

Above stated opening 12 is partially covered at the peripheral for preventing the inner sliding unit 2 to be released.

The invention claimed is:

1. An extension structure for a plastic molding portable memory product, comprising:
   an outer casing unit in a slightly long and hollow shape, wherein an internal thereof is a space, one end is installed with opening, a top face forms a hollow section and both sides of the hollow section installed respectively a first slot and a second slot;
   an inner sliding unit housed in the space of the outer casing unit for sliding in and out, wherein one end thereof is a USB insertion end, at a proper location at top is installed with a pressing element, the pressing element has a slight elastic function, a side of the pressing element is installed with a spring, and the spring is moved between the first slot and the second slot; and
   a closing unit, for tucking at end of the space of the outer casing unit,
   wherein the closing unit contains a tucking element, a top of the tucking element is installed with a top board; another side board is installed on outside at back of the tucking element, on the outside of the side board an extension element is installed, the extension element is installed with a through hole, and a bottom of the tucking element is in addition installed with a guiding slot and a click-in slot.

2. The extension structure for a plastic molding portable memory product as claimed in claim 1, wherein the outer casing unit, the inner sliding unit, and the closing unit are respectively formed in one body plastic material.

3. The extension structure for a plastic molding portable memory product as claimed in claim 1, wherein the inner sliding unit is installed a PCB component in an internal thereof.

4. The extension structure for a plastic molding portable memory product as claimed in claim 1, wherein the pressing element is simply leaning against on the inner sliding unit, so a bottom section of the pressing element forms hollow and slightly having elastic function.

5. The extension structure for a plastic molding portable memory product as claimed in claim 1, wherein the space of the outer casing unit is installed with a click-in block within, and the click-in block is installed in a respective position of guiding slot and click-in slot.

6. The extension structure for a plastic molding portable memory product as claimed in claim 1, wherein the bottom of the space is installed with sliding track.

\* \* \* \* \*